United States Patent
Cai et al.

(10) Patent No.: US 12,527,237 B2
(45) Date of Patent: Jan. 13, 2026

(54) ELECTRODES OF SEMICONDUCTOR MEMORY DEVICES HAVING CORNERS OF ACUTE ANGLES

(71) Applicant: GlobalFoundries Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 894 days.

(21) Appl. No.: 17/656,002

(22) Filed: Mar. 23, 2022

(65) Prior Publication Data

US 2023/0320240 A1  Oct. 5, 2023

(51) Int. Cl.
*H01L 45/00* (2006.01)
*H01L 27/24* (2006.01)
*H10B 63/00* (2023.01)
*H10N 70/00* (2023.01)

(52) U.S. Cl.
CPC ........... *H10N 70/841* (2023.02); *H10B 63/80* (2023.02); *H10N 70/021* (2023.02)

(58) Field of Classification Search
CPC .................................................... H10N 70/841
See application file for complete search history.

(56) References Cited

U.S. PATENT DOCUMENTS

| | | | |
|---|---|---|---|
| 2007/0012956 A1* | 1/2007 | Gutsche | H10N 70/8418 257/246 |
| 2007/0045605 A1* | 3/2007 | Hsueh | H10B 63/20 257/E29.17 |
| 2009/0200640 A1* | 8/2009 | Hosoi | H10N 70/8833 257/536 |
| 2010/0019218 A1* | 1/2010 | Chung | H10N 70/883 257/4 |
| 2010/0084741 A1* | 4/2010 | Andres | H10N 70/8828 257/536 |
| 2010/0110759 A1* | 5/2010 | Jin | H10N 70/063 257/E47.001 |
| 2011/0024710 A1* | 2/2011 | Bratkovski | H10N 70/826 257/536 |
| 2011/0227030 A1* | 9/2011 | Pickett | H10B 63/82 257/4 |
| 2015/0236256 A1* | 8/2015 | Walls | H10B 63/80 257/3 |
| 2020/0328346 A1* | 10/2020 | Kong | H10N 70/8418 |
| 2021/0020834 A1 | 1/2021 | Loy et al. | |
| 2021/0225936 A1 | 7/2021 | Wang et al. | |
| 2023/0157187 A1* | 5/2023 | Chiang | H10B 63/80 257/4 |

* cited by examiner

*Primary Examiner* — Peter Bradford
(74) *Attorney, Agent, or Firm* — David Cain

(57) ABSTRACT

According to an aspect of the present disclosure, a memory device is provided. The memory device includes a dielectric layer having a top surface, a first electrode having a bottom surface, a switching layer, and a second electrode. The bottom surface of the first electrode is arranged below the top surface of the dielectric layer. The first electrode includes a first corner having a first acute angle and a second corner having a second acute angle arranged over the top surface of the dielectric layer. The switching layer is arranged over the first electrode. The second electrode is arranged over the switching layer, and at least the first corner of the first electrode extends into the second electrode.

18 Claims, 6 Drawing Sheets

ELECTRODES OF SEMICONDUCTOR MEMORY DEVICES HAVING CORNERS OF ACUTE ANGLES

TECHNICAL FIELD

The present disclosure relates generally to semiconductor devices, and more particularly to semiconductor memory devices and methods of forming the same.

BACKGROUND

Semiconductor memory devices can be generally split into volatile memory devices and non-volatile memory (NVM) devices. Resistive random-access memory (RRAM) devices are a type of non-volatile memory (NVM) device.

An RRAM device uses a switching layer arranged between two electrodes. The switching layer may exhibit different resistance states, such as a high-resistance state and a low-resistance state. The RRAM device may operate by switching between those resistance states to represent one or more bits of information.

The switching layer is normally insulating and exhibits a high-resistance state. The resistance states of the RRAM device may be changed to a low-resistance state by applying a suitable potential difference between the electrodes to form conductive filaments in the switching layer. However, the conductive filaments are often randomly formed across many locations within the switching layer, thereby subjecting the RRAM device to poor electrical performance with undesirable device-to-device variability and cycle-to-cycle variability.

SUMMARY

To achieve the foregoing and other aspects of the present disclosure, semiconductor memory devices and methods of forming the same are presented.

According to an aspect of the present disclosure, a memory device is provided. The memory device includes a dielectric layer having a top surface, a first electrode having a bottom surface, a switching layer, and a second electrode. The bottom surface of the first electrode is arranged below the top surface of the dielectric layer. The first electrode includes a first corner having a first acute angle and a second corner having a second acute angle arranged above the top surface of the dielectric layer. The switching layer is arranged over the first electrode. The second electrode is arranged over the switching layer, and at least the first corner of the first electrode extends into the second electrode.

According to another aspect of the present disclosure, a memory device is provided. The memory device includes a first dielectric layer having a top surface, a first bottom electrode having a bottom surface, a second bottom electrode, a switching layer, and a first top electrode. The bottom surface of the first top electrode is arranged below the top surface of the first dielectric layer. The second bottom electrode is arranged immediately adjacent to and substantially parallel to the first bottom electrode. The first bottom electrode and the second bottom electrode each includes a first corner having a first acute angle and a second corner having a second acute angle arranged above the top surface of the dielectric layer. The first corner of the second bottom electrode is arranged proximate to the first corner of the first bottom electrode. The switching layer is arranged over the first bottom electrode and the second bottom electrode. The first top electrode is arranged over the switching layer and the first corner of the first bottom electrode and the first corner of the second bottom electrode extend into the first top electrode.

According to yet another aspect of the present disclosure, a method of forming a memory device is provided. The method includes forming a first electrode including a first corner having a first acute angle, a second corner having a second acute angle, and a bottom surface arranged below a top surface of a dielectric layer. A switching layer is formed over the first electrode. A second electrode is formed over the switching layer, and at least the first corner of the first electrode extends into the second electrode.

BRIEF DESCRIPTION OF THE DRAWINGS

The embodiments of the present disclosure will be better understood from a reading of the following detailed description, taken in conjunction with the accompanying drawings.

Figure 1A:
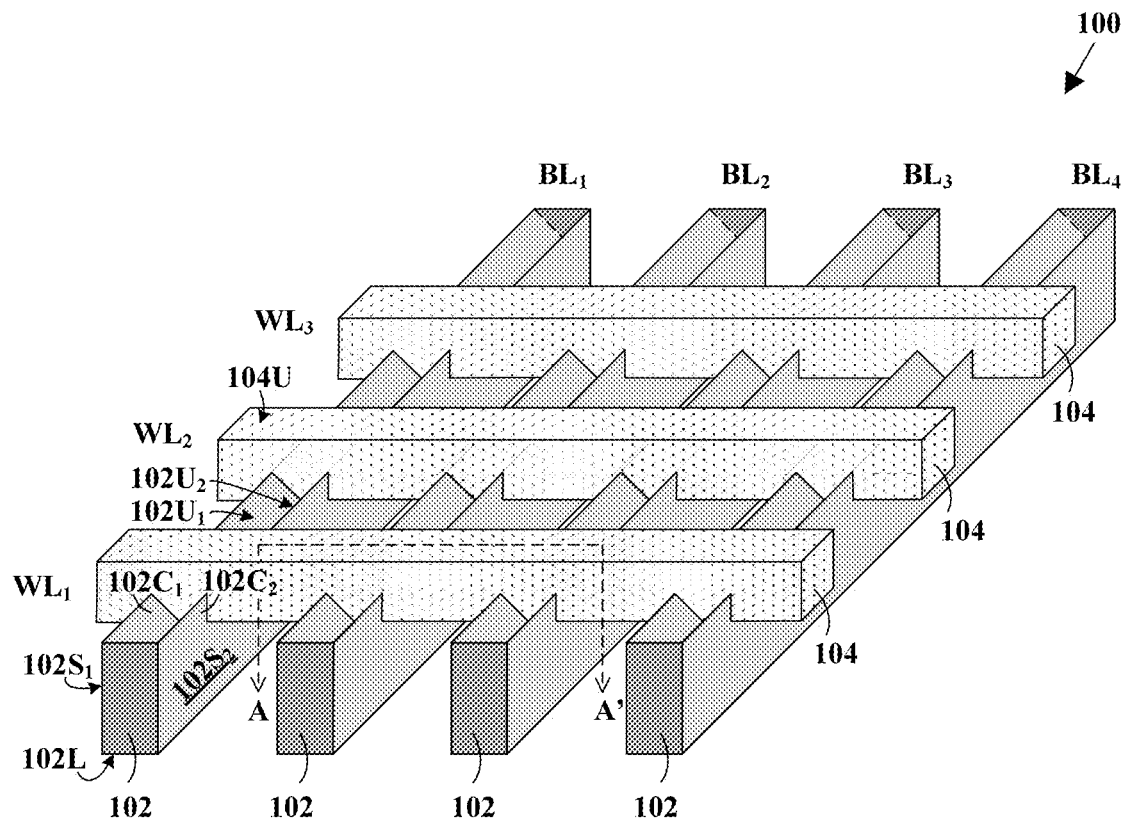
FIG. 1A is a perspective view of a memory device and FIG. 1B is a cross-sectional view of the memory device (taken across a line A-A'), according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to semiconductor memory devices and methods of forming the same.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1B:
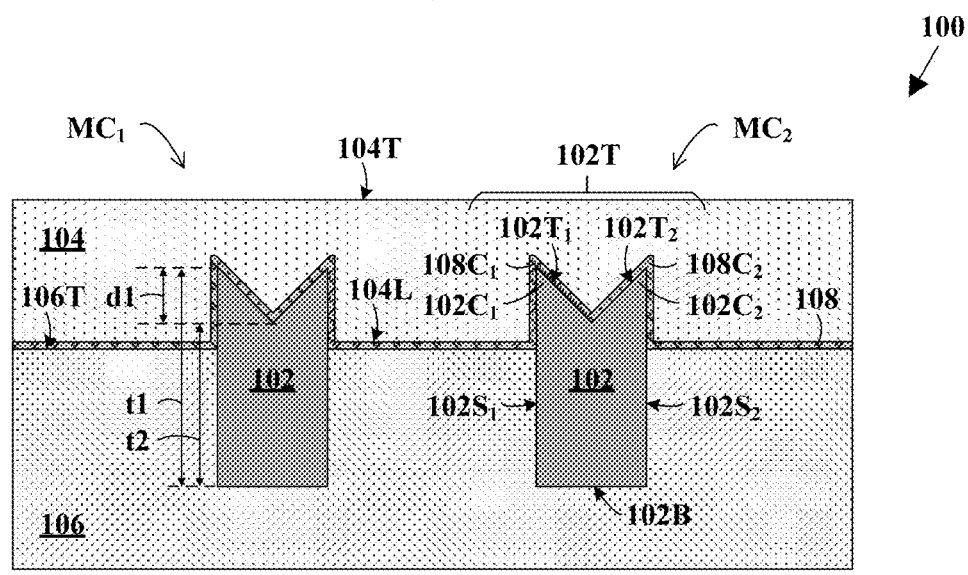
Figure 1C:
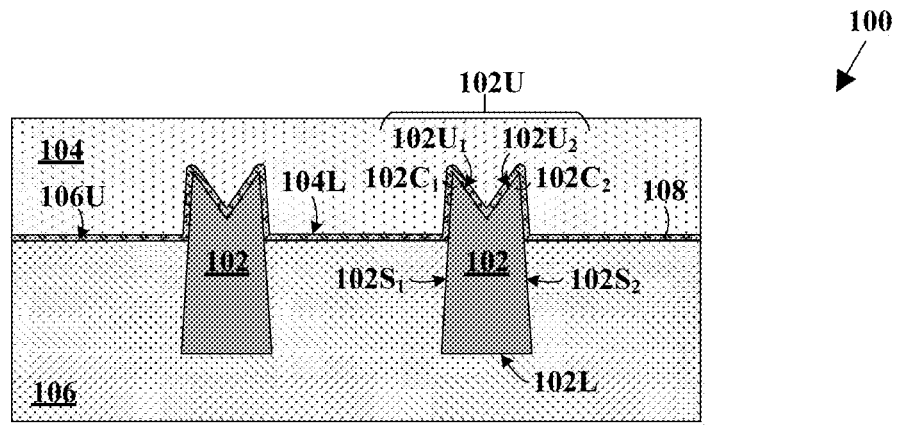
FIGS. 1C through 1E are cross-sectional views illustrating exemplary embodiments of the memory device in FIG. 1B.
Figure 1D:
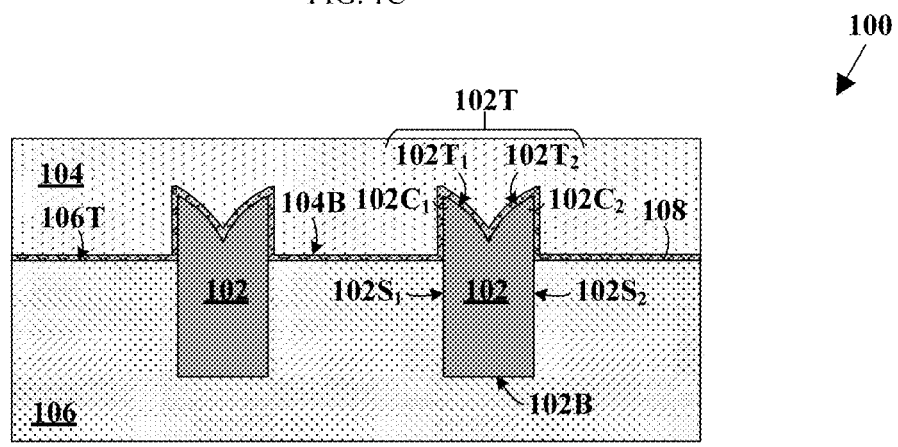
Figure 1E:
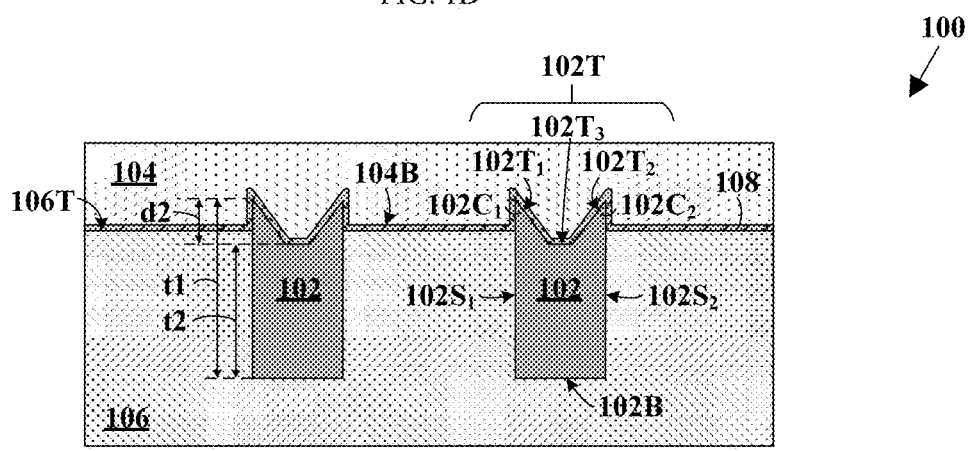

FIG. 1A is a perspective view of a memory device 100 and FIG. 1B is a cross-sectional view of the memory device 100 (taken across a line A-A'), according to an embodiment of the disclosure. FIGS. 1C through 1E are cross-sectional views illustrating exemplary cross-sectional embodiments of the memory device 100. The memory device 100 may be arranged in a memory cell region of a semiconductor device (not shown) and the memory device 100 may be part of a plurality of memory devices arranged in an array configuration of rows and columns in the memory cell region.

The memory device 100 may include a plurality of electrodes 102 and a plurality of electrodes 104 arranged over the plurality of electrodes 102. The plurality of electrodes 102 may be arranged substantially parallel to each other, and the plurality of electrodes 104 may be arranged substantially parallel to each other. The plurality of electrodes 104 may be arranged substantially perpendicular to a lengthwise direction of the plurality of electrodes 102. As used herein, the term "lengthwise direction" is a direction along which a feature, such as the electrode 102, extends the most. In an embodiment of the disclosure, the electrodes 102 may be referred to as bottom electrodes, and the electrodes 104 may be referred to as top electrodes.

Each electrode 102 may be electrically coupled to at least one electrode 104. As used herein, when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

The electrode 102 and the electrode 104 may include a conductive material, for example, a semiconductor material, a metallic material, or combinations thereof. The semiconductor material may include, for example, monocrystalline silicon, polycrystalline silicon, germanium, or combinations thereof. The metallic material may include, for example, copper, aluminum, tungsten, cobalt, nickel, hafnium, gold, silver, ruthenium, platinum, titanium, titanium nitride, tantalum, tantalum nitride, or combinations thereof. In an embodiment of the disclosure, the electrode 102 may include the same conductive material as the electrode 104. In another embodiment of the disclosure, the electrode 102 may include a different conductive material than the electrode 104.

The plurality of electrodes 102 may be partially arranged in a dielectric layer 106. For example, the dielectric layer 106 may have a top surface 106T and each electrode 102 may have a lower portion arranged in the dielectric layer 106 and an upper portion extending above the top surface 106T of the dielectric layer 106, as illustrated in FIG. 1B. The dielectric layer 106 may serve to electrically isolate each electrode 102 from adjacent conductive features, such as an adjacent electrode 102. The dielectric layer 106 may include an electrically insulative material, for example, silicon oxide, carbon-doped silicon oxide, tetraethoxysilane (TEOS), borophosphosilicate glass (BPSG), undoped silicate glass (USG), or amorphous silicon.

In an embodiment of the disclosure, the plurality of electrodes 102 may be configured as conductive line structures and may function as word lines of the memory device 100. The plurality of electrodes 104 may also be configured as conductive line structures and may function as bit lines of the memory device 100. The memory device 100 may be arranged in a crossbar array configuration, for example, a plurality of bit lines and a plurality of word lines arranged in multiple rows and columns. Even though the memory device 100 is illustrated to include four bit lines $BL_1$ through $BL_4$ arranged in a column configuration and three word lines $WL_1$ through $WL_3$ arranged in a row configuration, the memory device 100 may take on other array configurations without departing from the spirit and scope of the present disclosure.

The memory device 100 may include a plurality of memory cells and each memory cell may be arranged at an intersection of a word line and a bit line. For example, as illustrated in FIG. 1B, the memory device 100 may include a memory cell $MC_1$ and a memory cell $MC_2$ arranged along a common word line $WL_1$. In another example, the memory cell $MC_1$ may be arranged at the intersection of the bit line $BL_2$ and the word line $WL_1$, and the memory cell $MC_2$ may be arranged at the intersection of the bit line $BL_3$ and the word line $WL_1$. Each memory cell $MC_1/MC_2$ may correspond to a one-bit memory cell.

The electrode 102 may include a bottom surface 102B, a side surface $102S_1$, a side surface $102S_2$, and a top surface 102T arranged above the bottom surface 102B. The bottom surface 102B of the electrode 102 may be substantially parallel to the top surface 106T of the dielectric layer 106 and may be arranged at a level lower than the top surface 106T. The side surface $102S_1$ and the side surface $102S_2$ may extend parallel to the lengthwise direction of the electrode 102. The side surface $102S_1$ may adjoin one end of the bottom surface 102B and one end of the top surface 102T, and the side surface $102S_2$ may adjoin the opposite ends of the bottom surface 102B and the top surface 102T. The side surface $102S_1$ may be substantially parallel to the side surface $102S_2$, as illustrated in FIGS. 1A and 1B. Alternatively, the side surface $102S_1$ and the side surface $102S_2$ may be tapered from the bottom surface 102B to the top surface 102T such that the width dimension between the side surface $102S_1$ and the side surface $102S_2$ decreases with increasing distance from the bottom surface 102B, as illustrated in FIG. 1C.

The top surface 102T of the electrode 102 may have a concave surface profile, i.e., the top surface 102T may extend inwardly towards the bottom surface 102B of the electrode 102. The top surface 102T may include at least a top surface portion $102T_1$ and a top surface portion $102T_2$. The top surface portion $102T_1$ and the top surface portion $102T_2$ may taper inwardly towards the bottom surface 102B of the electrode 102. For example, the top surface portion $102T_1$ may adjoin the side surface $102S_1$ to converge to a corner $102C_1$ having an acute angle, i.e., an angle of less than 90 degrees, and the top surface portion $102T_2$ may adjoin the side surface $102S_2$ to converge to a corner $102C_2$ having an acute angle. The acute angle of the corner $102C_1$ may be substantially similar to the acute angle of the corner $102C_2$.

In another example, the top surface 102T may extend to a maximum depth d1 below the corner $102C_1$ (or the corner $102C_2$), the maximum depth d1 is where the top surface 102T and the bottom surface 102B of the electrode 102 are vertically closest to each other. The electrode 102 may have a thickness t1 that corresponds to the height of the side surface $102S_1$ (or the side surface $102S_2$), and a thickness t2 that corresponds to the distance between the bottom surface 102B and the top surface 102T at the maximum depth d1.

The corner $102C_1$ of the electrode 102 may extend along the side surface $102S_1$ and the corner $102C_2$ may extend along the side surface $102S_2$ in the lengthwise direction of the electrode 102, as illustrated in FIG. 1A. The corner $102C_1$ and the corner $102C_2$ may be substantially pointed, for example, the top surface portion $102T_1$ and the side surface $102S_1$ acquiring an inverted "V-shaped" profile, or substantially rounded, for example, the top surface portion $102T_1$ and the side surface $102S_1$ acquiring an inverted "U-shaped" profile.

As mentioned above, the electrode 102 may be partially arranged in the dielectric layer 106. Specifically, at least the corner 102C$_1$ and the corner 102C$_2$ of the electrode 102 may be arranged above the dielectric layer 106, i.e., the corner 102C$_1$ and the corner 102C$_2$ may be spaced apart from the top surface 106T of the dielectric layer. For example, the entire top surface 102T of the electrode 102 may be arranged above and spaced apart from the dielectric layer 106, as illustrated in FIG. 1B. Alternatively, a portion of the top surface 102T of the electrode 102 may be arranged at a level lower than the top surface 106T of the dielectric layer 106, as illustrated in FIG. 1E.

The top surface 102T of the electrode 102 may include various top surface profiles. In an embodiment of the disclosure, the top surface portion 102T$_1$ and the top surface portion 102T$_2$ may each have a substantially flat surface profile, for example, the cross-sectional view of the electrode 102 as shown in FIG. 1B illustrates the top surface portion 102T$_1$ and the top surface portion 102T$_2$ as each having a substantially straight line. In another example, the top surface portion 102T$_1$ and the top surface portion 102T$_2$ may taper inwardly towards the bottom surface 102B of the electrode 102 with a substantially similar constant gradient of an absolute value. The top surface portion 102T$_1$ and the top surface portion 102T$_2$ may converge to form a "V-shaped" groove.

In another embodiment of the disclosure, the top surface portion 102T$_1$ and the top surface portion 102T$_2$ may each have a convex surface profile, as illustrated in FIG. 1D. For example, the top surface portion 102T$_1$ may taper inwardly towards the bottom surface 102B of the electrode 102 with a gentler gradient proximate to the corner 102C$_1$ and a steeper gradient proximate to the top surface 106T of the dielectric layer 106. Similarly, the top surface portion 102T$_2$ may include a gentler gradient proximate to the corner 102C$_2$ and a steeper gradient proximate to the top surface 106T of the dielectric layer 106.

FIG. 1E illustrates yet another top surface profile of the electrode 102, according to an embodiment of the disclosure. The top surface 102T of the electrode 102 may further include a top surface portion 102T$_3$ arranged between and adjoining the top surface portion 102T$_1$ and the top surface portion 102T$_2$. For example, the top surface portion 102T$_3$ may converge with the top surface portion 102T$_1$ and the top surface portion 102T$_2$ to form two laterally opposite corners each having an angle of at least 90 degrees; the corners may be substantially sharp or substantially rounded. The top surface portions 102T$_1$, 102T$_2$, and 102T$_3$ may form a "U-shaped" groove. The top surface portion 102T$_3$ may be arranged at a maximum depth D2 below the corner 102C$_1$ or the corner 102C$_2$ to form a "U-shaped" groove.

The top surface portion 102T$_3$ may have a substantially flat surface profile and may be arranged substantially parallel to the bottom surface 102B of the electrode 102. As illustrated, the top surface portion 102T$_3$ may be arranged at a level lower than the top surface 106T of the dielectric layer 106. Alternatively, the top surface portion 102T$_3$ may be arranged above and spaced apart from the top surface 106T the dielectric layer 106.

Even though the top surface portion 102T$_1$ and the top surface portion 102T$_2$ of the electrode 102 in FIG. 1E are illustrated to have substantially flat surface profiles, the top surface portion 102T$_1$ and the top surface portion 102T$_2$ may each have a convex surface profile, similar to the top surface portion 102T$_1$ and the top surface portion 102T$_2$ illustrated in FIG. 1D.

The memory device 100 may further include a switching layer 108 arranged between the electrode 102 and the electrode 104. The switching layer 108 may be conformal to the top surface 102T of the electrode 102, i.e., the switching layer 108 may have a substantially equal thickness and has a portion that follows the surface profile of the portion of the electrode 102 that extends above the top surface 106T of the dielectric layer 106. For example, the switching layer 108 may at least overlay the corner 102C$_1$ and the corner 102C$_2$ of the electrode 102, i.e., a portion of the switching layer 108 may overlay a portion of the side surface 102S$_1$, a portion of the side surface 102S$_2$, a portion of the top surface portion 102T$_1$ and a portion of the top surface portion 102T$_2$. In another example, the switching layer 108 may also include a corner 108C$_1$ having an acute angle and a corner 108C$_2$ having an acute angle. The corner 108C$_1$ and the corner 108C$_2$ of the switching layer 108 may be proximate to the corner 102C$_1$ and the corner 102C$_2$ of the electrode 102, respectively.

The switching layer 108 may include a resistive dielectric material, for example, silicon oxide, hafnium oxide, tantalum oxide, titanium oxide, aluminum oxide, tungsten oxide, zirconium oxide, gadolinium oxide, magnesium oxide, or combinations thereof. In an embodiment of the disclosure, the switching layer 108 may have a thickness ranging from about 2 nm to about 10 nm.

The electrode 102 may be partially arranged in the electrode 104. For example, at least the corner 102C$_1$ and the corner 102C$_2$ of the electrode 102 may be arranged in the electrode 104. The corner 102C$_1$ and the corner 102C$_2$ of the electrode 102 may extend into and terminate within the electrode 104, i.e., the corner 102C$_1$ and the corner 102C$_2$ may not extend through the electrode 104 and a portion of the electrode 104 may be arranged over the corner 102C$_1$ and the corner 102C$_2$ of the electrode 102. In another example, the electrode 104 may include a bottom surface 104B, and the bottom surface 104B of the electrode 104 may be arranged at a level lower than the corner 102C$_1$ and the corner 102C$_2$ of the electrode 102. The electrode 104 may further include a top 104T and the top surface 104T of the electrode 104 may have a substantially flat surface profile.

The memory device 100 may include a filament-type resistive random-access memory (RRAM) device such as, but is not limited to, an oxide random-access memory (OxRAM) device or a conductive bridge random-access memory (CBRAM) device. The switching layer 108 may exhibit different resistance states, such as a high-resistance state and a low-resistance state, and the memory device 100 may operate by switching between those resistance states of the switching layer 108. The low-resistance state and the high-resistance state of the switching layer 108 may be used to represent one or more bits of information.

To program the memory device 100, a suitable potential difference may be applied between the electrode 102 and the electrode 104 to cause a dielectric breakdown of the switching layer 108. Conductive paths in a form of conductive filaments may be formed in the switching layer 108. The conductive filaments may be formed by diffusion or drift of electrical charges, for example, ions or electrons, from the electrode 104 or the electrode 102 induced by the potential difference to the other electrode. The conductive filaments may provide electrical coupling between the electrode 102 and electrode 104, and the switching layer 108 may be conductive and may exhibit a low-resistance state; the low-resistance state is representative of an "on" or "1" state.

To erase the memory device 100, a suitable potential difference may be applied between the electrode 102 and the electrode 104 to break the conductive filaments in the switching layer 108, reverting the switching layer 108 to the insulative high-resistance state; the high-resistance state is representative of an "off" or "0" state.

The corner $102C_1$ and the corner $102C_2$ of the electrode 102 may advantageously improve the electrical performance of the memory device 100. Electric fields generated at corners or tapered regions of conductive structures may be relatively stronger than that of non-corner regions, i.e., a stronger localization of electric fields may be generated around the corner $102C_1$ and the corner $102C_2$ of the electrode 102. Therefore, during a program operation, the relatively stronger electric fields generated around the corner $102C_1$ and the corner $102C_2$ of the electrode 102 may substantially confine the formation of the conductive filaments to a region in the switching layer 108 that is proximate to the corner $102C_1$ and the corner $102C_2$.

The ability to confine the formation of the conductive filaments is advantageous to minimize the variability of locations where the conductive filaments may be formed. The conductive filaments may not randomly form within the switching layer 108. Such filament confinement may reduce the stochasticity of the conductive filaments, which in turn reduces the resistance variability of the switching layer 108 in the high-resistance state. Controlled distribution of the conductive filaments may enhance the electrical performance of the memory device 100, such as providing low device-to-device variability and cycle-to-cycle variability. Accordingly, the memory device 100 may achieve stable switching between the resistance states of the switching layer 108 during the program operations and the erase operations and may also reduce the overall power consumption of the memory device 100.

Figure 2A:
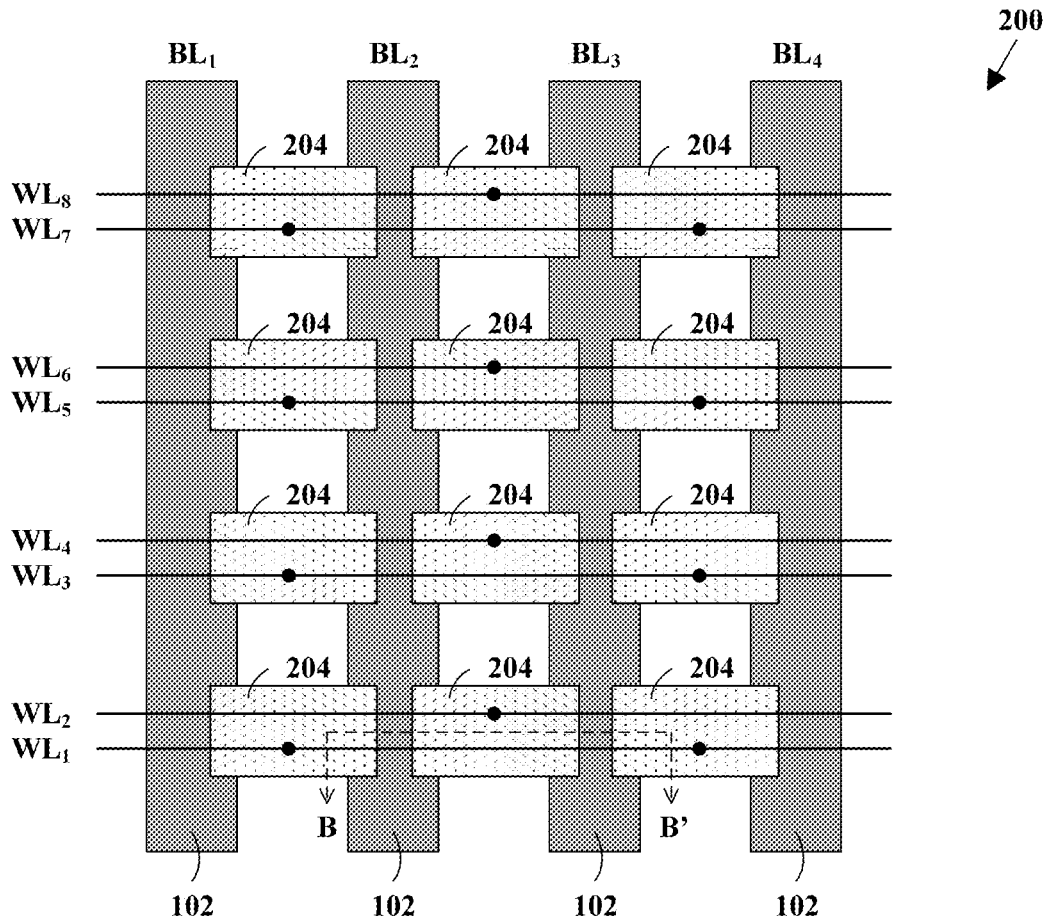
FIG. 2A is a top-down view of a memory device and FIG. 2B is a cross-sectional view of the memory device (taken along a line B-B'), according to another embodiment of the disclosure.
Figure 2B:
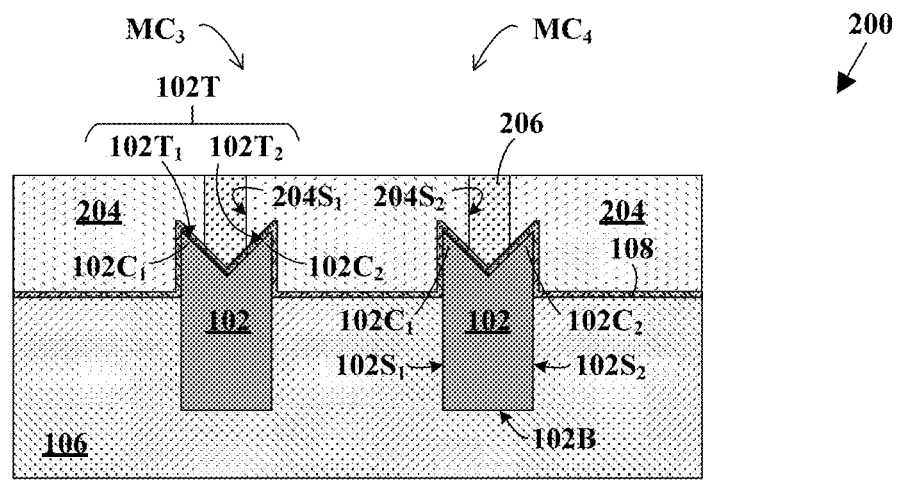

FIG. 2A is a top-down view of a memory device 200 and FIG. 2B is a cross-sectional view of the memory device 200 (taken along a line B-B'), according to another embodiment of the disclosure. The memory device 200 may be similar to the memory device 100 in FIGS. 1A and 1B, and thus common features are labeled with the same reference numerals and need not be discussed.

The memory device 200 may include a plurality of electrodes 204 arranged above the plurality of electrodes 102. The plurality of electrodes 204 may be arranged in a regular array configuration of multiple rows and columns. For example, each electrode 204 may be substantially aligned in a row configuration with an adjacent electrode 204 and in a column configuration with another adjacent electrode 204. Each electrode 204 may be electrically coupled to a conductive line that may function as a word line of the memory device 200.

The plurality of electrodes 204 may be arranged in a dielectric layer 206 and the dielectric layer 206 may serve to electrically isolate the plurality of electrodes 204 from each other. The dielectric layer 206 may be arranged over a portion of the top surface 102T of the electrode 102. The dielectric layer 206 may include an electrically insulative material, for example, silicon oxide, carbon-doped silicon oxide, tetraethoxysilane (TEOS), borophosphosilicate glass (BPSG), undoped silicate glass (USG), or amorphous silicon and may not necessarily include the same electrically insulative material as the dielectric layer 106.

Each electrode 204 may be at least partially arranged over at least one electrode 102. For example, the electrode 204 may partially overlay two electrodes 102, i.e., the corner $102C_2$ of the electrode 102 and the corner $102C_1$ of an immediately adjacent electrode 102. In another example, the electrode 204 may include a side surface $204S_1$ that terminates over the top surface portion $102T_2$ of the electrode 102 and a laterally opposite side surface $204S_2$ that terminates over the top surface portion $102T_2$ of the adjacent electrode 102.

The electrode 204 may form a memory cell $MC_3$ with the electrode 102 and a memory cell $MC_4$ with the adjacent electrode 102. The memory device 200 may include a higher density of memory cells than the memory device 100 in FIG. 1A.

Figure 3:
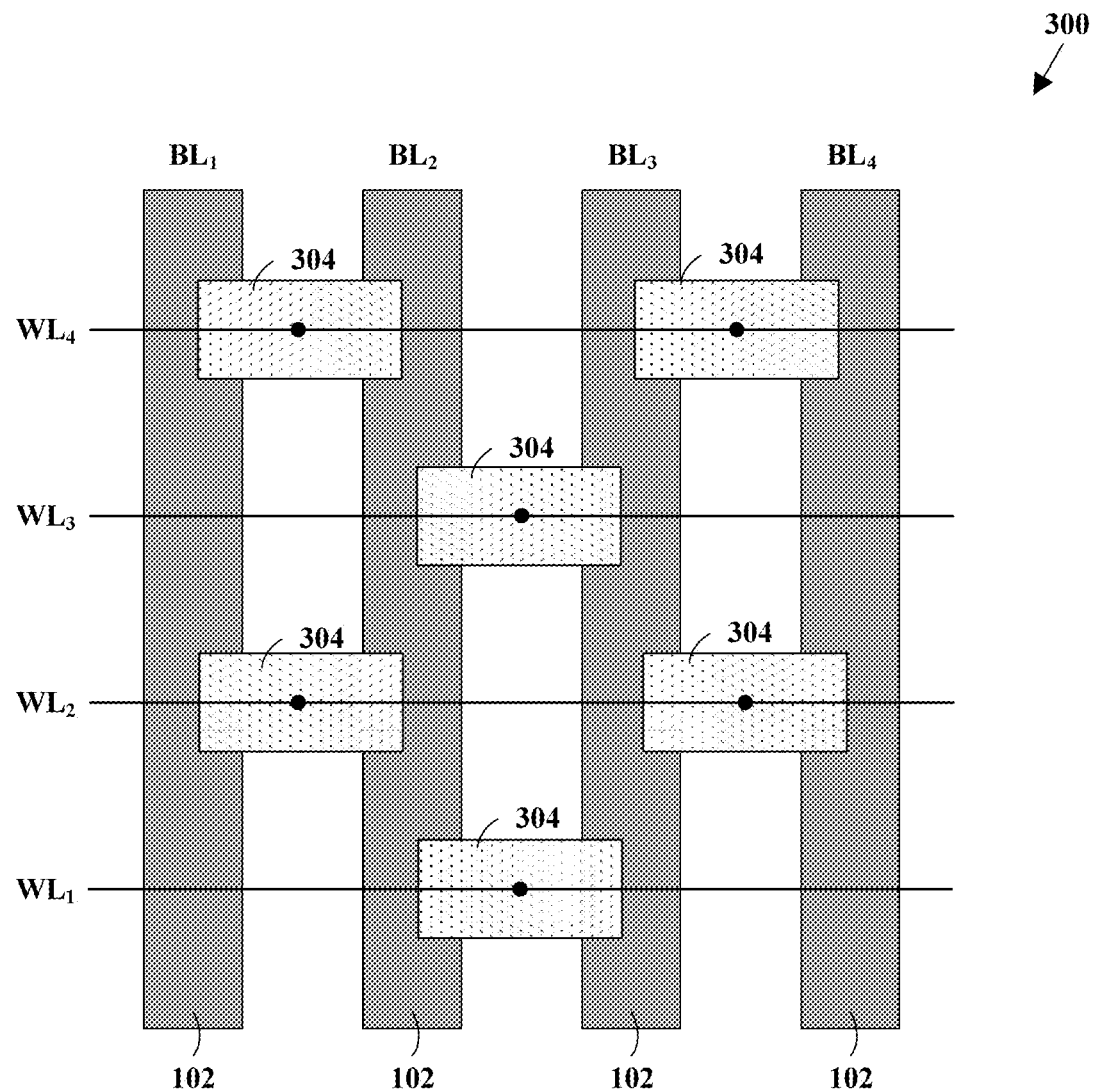
FIG. 3 is a top-down view of a memory device, according to yet another embodiment of the disclosure.

FIG. 3 is a top-down view of a memory device 300, illustrating an alternative arrangement of a plurality of electrodes 304, according to yet another embodiment of the disclosure. The memory device 300 may be similar to the memory device 200 in FIG. 2A, and thus common features are labeled with the same reference numerals and need not be discussed.

The plurality of electrodes 304 may be arranged over the plurality of electrodes 102. The plurality of electrodes 304 may be arranged in a staggered array configuration. For example, each electrode 304 may be offset from an immediately adjacent electrode 304. Similar to the memory device 200, each electrode 304 may be at least partially arranged over at least one electrode 102 and may be electrically coupled to a conductive line that may function as a word line of the memory device 300.

FIGS. 4A to 4D are cross-sectional views that illustrate a method of forming a plurality of electrodes 102 of a memory device 400, according to an embodiment of the disclosure. The memory device 400 may be similar to the memory device 100 in FIG. 1B, and thus common features are labeled with the same reference numerals. Certain structures may be fabricated, for example, using known processes and techniques, and specifically disclosed processes and methods may be used to achieve individual aspects of the present disclosure.

As used herein, "deposition techniques" refer to the process of applying a material over another material (or a substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD), or electro-plating.

Additionally, "patterning techniques" include deposition of material or photoresist, patterning, exposure, development, etching, cleaning, and/or removal of the material or photoresist as required in forming a described pattern, structure, or opening 420. Exemplary examples of techniques for patterning include, but are not limited to, wet etch lithographic processes, dry etch lithographic processes, or direct patterning processes.

Figure 4A:
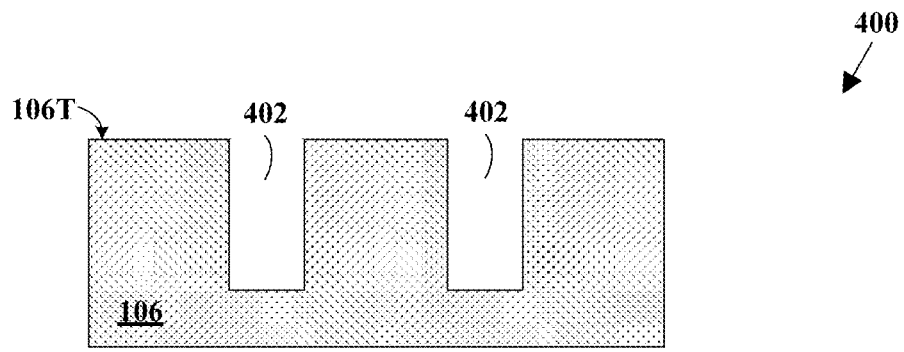
FIGS. 4A to 4D are cross-sectional views that illustrate a method of forming electrodes of a memory device, according to an embodiment of the disclosure.

As illustrated in FIG. 4A, a dielectric layer 106 having a top surface 106T may be provided. Openings 402 may be formed in the dielectric layer 106 using a patterning technique. The openings 402 may have a width that substantially corresponds to the width of the electrodes 102 that will be subsequently formed. Even though the openings 402 are illustrated to terminate within the dielectric layer 106, this may not be necessarily so, and the openings 402 may extend through the dielectric layer 106. The dielectric layer 106 may include an electrically insulative material, for example, silicon oxide, carbon-doped silicon oxide, tetraethoxysilane (TEOS), borophosphosilicate glass (BPSG), undoped silicate glass (USG), or amorphous silicon.

Figure 4B:
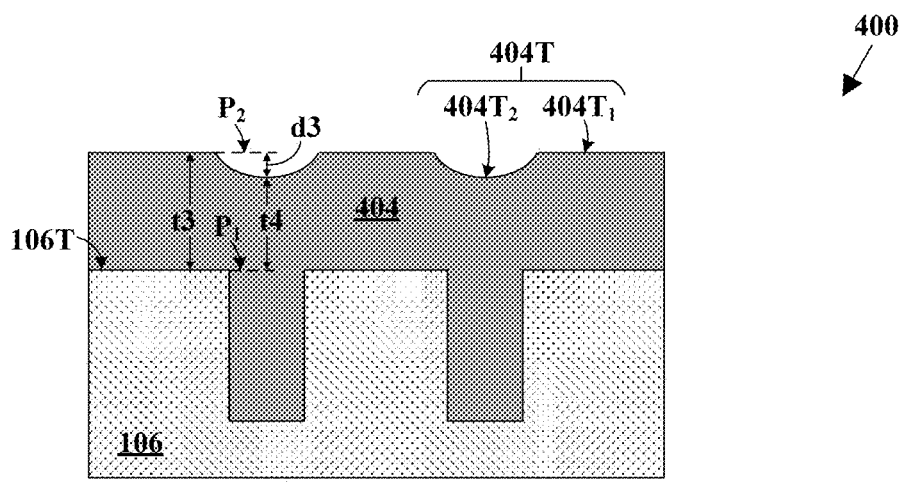

FIG. 4B illustrates the memory device 400 after depositing a layer of conductive material 404 in the openings 402, according to an embodiment of the disclosure. The conductive material 404 may be deposited using a deposition technique to overfill the openings 402 such that the conductive material 404 may overlay the top surface 106T of the dielectric layer 106. The conductive material 404 may include a semiconductor material, a metallic material, or combinations thereof.

Due to the presence of the openings 402 in the dielectric layer 106, the conductive material 404 may not achieve a substantially flat surface profile. For example, the conductive material 404 may acquire a top surface 404U including a top surface portion $404T_1$ having a substantially flat surface profile and a top surface portion $404TU_2$ having a concave surface profile. The top surface portion $404T_1$ may be arranged above the top surface 106T of the dielectric layer 106 and the top surface $404T_2$ may be arranged above the openings 402 of the dielectric layer 106.

The top surface portion $404T_2$ may extend inwardly to a maximum depth d3 from the top surface portion $404T_1$; the maximum depth d3 is where the top surface portion $404T_2$ and a plane $P_1$ that is substantially coplanar with the top surface 106T of the dielectric layer 106 are vertically closest to each other. For example, the conductive material 404 may have a thickness t3 that corresponds to a distance between the top surface portion $404T_1$ and the plane $P_1$, and a thickness t4 that corresponds to a distance between a plane $P_2$ substantially coplanar with the maximum depth d3 of the top surface portion $404T_2$ and the plane $P_2$; the thickness t4 is thinner than the t3 thickness.

In an embodiment of the disclosure, a liner may be deposited in the openings 402 before the deposition of the conductive material 404, although not shown in FIG. 4B. The liner may include an adhesion liner and/or a barrier liner. The liner may include metal silicides or metal nitrides. The metal silicides may include, for example, titanium silicide or nickel silicide. The metal nitrides may include, for example, titanium nitride or tantalum nitride.

Figure 4C:
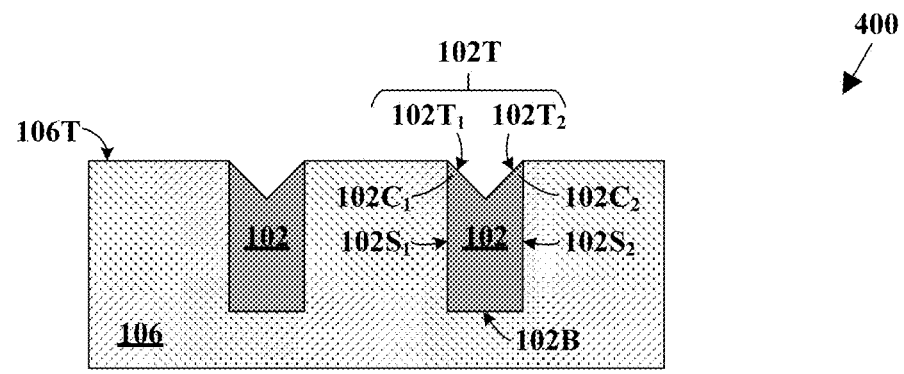

FIG. 4C illustrates the memory device 400 after forming the plurality of electrodes 102, according to an embodiment of the disclosure. A portion of the conductive material 404 may be removed until the top surface 106T of the dielectric layer 106 is exposed, leaving a portion of the conductive material 404 in the openings 402 of the dielectric layer 106 to form the electrodes 102.

The removal of the conductive material 404 may be performed using a directional material removal technique, such as an anisotropic etching process. Due to the substantially constant material removal rate of the material removal technique, the electrodes 102 may acquire a concave top surface 102T having at least a top surface portion $102T_1$ and a top surface portion $102T_2$. The concave top surface 102T may form a corner $102C_1$ and a corner $102C_2$ having acute angles with side surfaces $102S_1$ and $102S_2$ of the electrode 102.

Figure 4D:
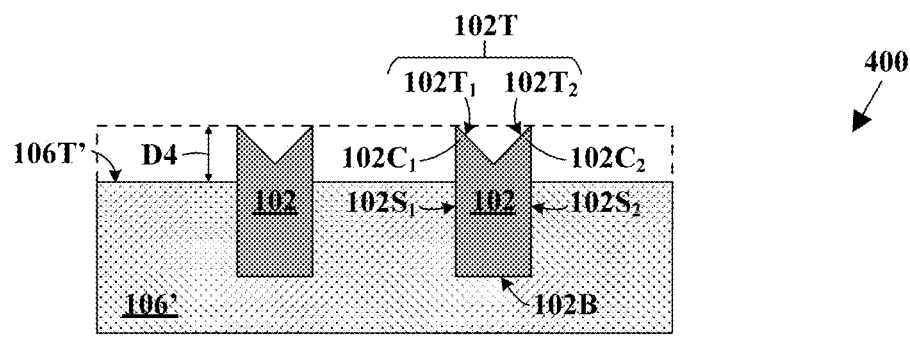

FIG. 4D illustrates the memory device 400 after recessing the dielectric layer 106, according to an embodiment of the disclosure. The dielectric layer 106 may be recessed to a depth below the corner $102C_1$ and the corner $102C_2$ of the electrode 102 to form the recessed dielectric layer 106'; the portion of the dielectric layer 106 removed is demarcated by a dotted line. The dielectric layer 106 may be recessed to a depth D4 as illustrated, for example, the top surface 106T' of the recessed dielectric layer 106' may be arranged below and spaced apart from the top surface 102T of the electrode 102, though not necessarily so, as long as the corner $102C_1$ and the corner $102C_2$ of the electrode 102 extend above and spaced apart from the top surface 106T' of the recessed dielectric layer 106'.

The memory device 400 may undergo further processing steps, such as depositing a resistive dielectric material over the electrodes 102 to form a switching layer and depositing and patterning a conductive material over the switching layer to form the electrodes 104 as illustrated in FIG. 1A, 2A, or 3.

Figure 5:
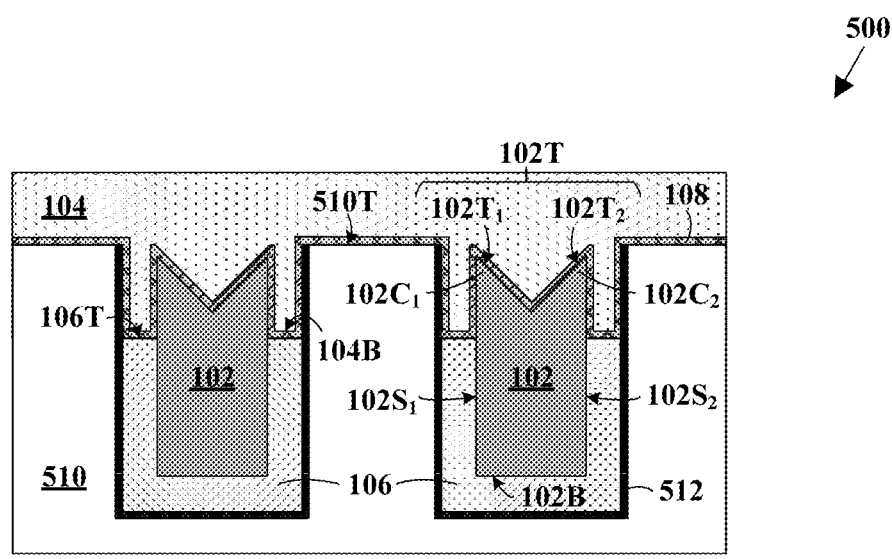
FIG. 5 is a cross-sectional view of a memory device, according to an alternative embodiment of the disclosure.

FIG. 5 is a cross-sectional view of a memory device 500, according to an alternative embodiment of the disclosure. The memory device 500 may be similar to the memory device 100 in FIG. 1B, and thus common features are labeled with the same reference numerals and need not be discussed.

The plurality of electrodes 102 may be arranged in a substrate 510 of the memory device 500. The substrate 510 may have a top substrate surface 510T. The substrate 510 may include various configurations, such as a bulk semiconductor material or a composite material, for example, a semiconductor-on-insulator (SOI) substrate having a single crystalline semiconductor material, a buried insulator layer under the single crystalline semiconductor material, and a carrier substrate under the buried insulator layer. The semiconductor substrate may include any suitable semiconductor material, such as silicon, silicon germanium, silicon carbon, other II-VI or III-V semiconductor compounds, and the like.

A plurality of substrate openings (not shown) may be arranged in the substrate 510, within which each electrode 102 and the dielectric layer 106 may be arranged therein. The plurality of substrate openings may be formed by a patterning technique, and the plurality of substrate openings may not extend through the substrate 510. In an embodiment where the substrate 510 includes a composite material, the plurality of substrate openings may be formed in the single crystalline semiconductor material. The corner $102C_1$ and the corner $102C_2$ of the electrode 102 may or may not extend above the substrate opening. For example, as illustrated in FIG. 5, the corner $102C_1$ and the corner $102C_2$ of the electrode 102 may be arranged below the top substrate surface 510T. Alternatively, the corner $102C_1$ and the corner $102C_2$ of the electrode 102 may be arranged above the top substrate surface 510T, even though this embodiment is not illustrated in the accompanying drawings.

A spacer liner 512 may be arranged in the plurality of substrate openings. The spacer liner 512 may be formed by a conformal deposition technique, for example, an ALD process or a conformal CVD process. The spacer liner 512 may be fully arranged within the substrate opening, according to an embodiment of the disclosure. In an alternative embodiment of the disclosure, a portion of the spacer liner 512 may be fully arranged within the substrate opening and another portion of the spacer liner 512 may be arranged over the upper surface 510U of the substrate. The spacer liner 512 may include an electrically insulative material, for example, silicon nitride or silicon oxide-silicon nitride-silicon oxide (ONO).

The dielectric layer 106 may partially fill the substrate opening. For example, the dielectric layer 106 may be arranged such that a lower portion of the electrode 102 may be arranged therein, and an upper portion of the electrode 102 may extend over the top surface 106T of the dielectric layer 106. Accordingly, the top surface 106T of the dielectric layer 106 may be arranged below the top substrate surface 510T. The dielectric layer 106 may be preferably formed by a conformal deposition technique, such that a dielectric opening (not shown) may be inherently formed, within which the electrode 102 may be arranged therein. In the embodiment where the dielectric layer 106 is formed by a non-conformal deposition technique, the dielectric opening may be subsequently formed by a patterning technique.

The switching layer 108 may be arranged over the electrode 102. A portion of the switching layer 108 may be fully arranged in the substrate opening and another portion of the switching layer 108 may be arranged over the top surface 510U of the substrate 510. The switching layer 108 may be conformal and a portion of the switching layer 108 may at least follow the surface profile of the electrode 102 that extends above the top surface 106T of the dielectric layer 106 in the substrate opening. The switching layer 108 may be further arranged over the top surface 102T of the electrode 102, the top surface 106T of the dielectric layer 106, a portion of the spacer liner 512, and the top substrate surface 510T. The spacer liner 512 may be formed by a conformal deposition technique.

The electrode 104 may be at least partially arranged over one electrode 102 such that at least the corner $102C_1$ or the corner $102C_2$ of the electrode 102 may be arranged in the electrode 104. The electrode 104 may be formed by a deposition technique.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A resistive random-access memory device, comprising:
   a dielectric layer comprising a top surface;
   a first electrode of a monolithic bulk conductive structure partially in the dielectric layer, the first electrode comprising:
   a non-planar top surface over the top surface of the dielectric layer;
   a bottom surface arranged below the top surface of the dielectric layer;
   a first corner having a first acute angle; and
   a second corner having a second acute angle, wherein the first corner and the second corner are arranged above and spaced apart from the top surface of the dielectric layer;
   a switching layer arranged over the first electrode; and
   a second electrode arranged over the switching layer, wherein at least the first corner of the first electrode extends into and partially embeds within the second electrode.

2. The resistive random-access memory device of claim 1, wherein the first electrode comprises:
   a first side surface;
   a second side surface; and
   the non-planar top surface is a concave surface, comprising a first top surface portion and a second top surface portion extending inwardly, the first top surface portion adjoins the first side surface to converge to the first corner and the second top surface portion adjoins the second side surface to converge to the second corner.

3. The resistive random-access memory device of claim 2, wherein the first top surface portion and the second top surface portion have substantially planar surface profiles that adjoin at an angle of less than 180 degrees.

4. The resistive random-access memory device of claim 2, wherein the first top surface portion and the second top surface portion have convex surface profiles.

5. The resistive random-access memory device of claim 2, wherein a portion of the concave top surface of the first electrode is arranged at a level lower than the top surface of the dielectric layer.

6. The resistive random-access memory device of claim 2, wherein the concave top surface of the first electrode further comprises a third top surface portion arranged between the first top surface portion and the second top surface portion, and the third top surface portion converges to a corner having an angle of at least 90 degrees with the first top surface portion.

7. The resistive random-access memory device of claim 6, wherein the third top surface portion of the first electrode is substantially parallel to the top surface of the dielectric layer.

8. The resistive random-access memory device of claim 2, wherein the first side surface and the second side surface are planar side surfaces, each including an upper portion over the top surface of the dielectric layer and a lower portion below the top surface of the dielectric layer.

9. The resistive random-access memory device of claim 1, wherein the second electrode of a monolithic bulk conductive structure comprises a top surface, and the top surface of the second electrode has a substantially planar surface profile.

10. The resistive random-access memory device of claim 1, wherein the memory device further comprising a substrate having an opening, and the first electrode and the dielectric layer are further arranged in the opening of the substrate.

11. The resistive random-access memory device of claim 10, wherein the substrate comprises a top substrate surface, and the top substrate surface is arranged above the top surface of the dielectric layer.

12. A resistive random-access memory device, comprising:
    a dielectric layer comprising a top surface;
    a first bottom electrode of a monolithic bulk conductive structure partially in the dielectric layer;
    a second bottom electrode arranged immediately adjacent to and substantially parallel to the first bottom electrode, wherein the first bottom electrode and the second bottom electrode each comprises:
        a non-planar top surface over the top surface of the dielectric layer;
        a bottom surface arranged below the top surface of the dielectric layer;
        a first corner having a first acute angle; and
        a second corner having a second acute angle, the first corner of the second bottom electrode is arranged proximate to the first corner of the first bottom electrode, wherein the first corner and the second corner of the first bottom electrode and the first corner and the second corner of the second bottom electrode are arranged above the top surface of the dielectric layer;
    a switching layer arranged over the first bottom electrode and the second bottom electrode; and
    a first top electrode arranged over the switching layer, wherein the first corner of the first bottom electrode and the first corner of the second bottom electrode extend into and partially embed within the first top electrode.

13. The resistive random-access memory device of claim 12, further comprising a second top electrode, the second top electrode is arranged immediately adjacent to and substantially parallel to the first top electrode.

14. The resistive random-access memory device of claim 13, wherein the first top electrode, the second top electrode, the first bottom electrode, and the second bottom electrode are line structures arranged in a crossbar array configuration.

15. The resistive random-access memory device of claim 13, wherein the second top electrode is partially arranged over the first corner of the first bottom electrode and the first corner of the second bottom electrode.

16. The resistive random-access memory device of claim 13, further comprising a third bottom electrode arranged immediately adjacent to and substantially parallel to the second bottom electrode, the third bottom electrode comprises a third corner arranged proximate to the second corner of the second bottom electrode and a fourth corner laterally opposite the third corner, and the second top electrode is partially arranged over the second corner of the second bottom electrode and the third corner of the third bottom electrode.

17. The resistive random-access memory device of claim 12, wherein the first top electrode is electrically coupled to a word line of the memory device.

18. The resistive random-access memory device of claim 12, wherein the first bottom electrode and the second bottom electrode are bit lines of the memory device.

* * * * *